(12) United States Patent
Morikazu et al.

(10) Patent No.: US 7,601,616 B2
(45) Date of Patent: Oct. 13, 2009

(54) WAFER LASER PROCESSING METHOD

(75) Inventors: Hiroshi Morikazu, Tokyo (JP); Ryugo Oba, Tokyo (JP); Yukio Morishige, Tokyo (JP); Toshio Tsuchiya, Tokyo (JP); Koji Yamaguchi, Tokyo (JP)

(73) Assignee: Disco Corporation, Tokyo (JP)

( * ) Notice: Subject to any disclaimer, the term of this patent is extended or adjusted under 35 U.S.C. 154(b) by 132 days.

(21) Appl. No.: 11/826,911

(22) Filed: Jul. 19, 2007

(65) Prior Publication Data

US 2008/0020548 A1 Jan. 24, 2008

(30) Foreign Application Priority Data

Jul. 20, 2006 (JP) ............................. 2006-198441

(51) Int. Cl.
*H01L 21/00* (2006.01)

(52) U.S. Cl. .................. 438/463; 438/460; 438/462; 438/795; 257/E21.596; 257/E21.602

(58) Field of Classification Search .................. 438/461, 438/707; 257/E21.517, E21.595, E21.596, 257/E21.6
See application file for complete search history.

(56) References Cited

U.S. PATENT DOCUMENTS

2005/0035100 A1 2/2005 Genda
2006/0009008 A1* 1/2006 Kaneuchi et al. ............ 438/463

FOREIGN PATENT DOCUMENTS

JP 2005-64231 3/2005

* cited by examiner

*Primary Examiner*—Savitri Mulpuri
*Assistant Examiner*—Cheung Lee
(74) *Attorney, Agent, or Firm*—Smith, Gambrell & Russell, LLP

(57) ABSTRACT

A wafer laser processing method for forming grooves along streets by applying a pulse laser beam along the streets for sectioning a plurality of devices of a wafer having the plurality of devices which are composed of a laminate consisting of an insulating film and a functional film, on the front surface of a substrate, wherein the pulse laser beam is set to have a repetition frequency of 150 kHz to 100 MHz and an energy per unit length of 5 to 25 J/m.

2 Claims, 5 Drawing Sheets

(a)

(b)

WAFER LASER PROCESSING METHOD

FIELD OF THE INVENTION

The present invention relates to a wafer laser processing method for forming grooves along streets formed on the front surface of a wafer such as a semiconductor wafer or the like.

DESCRIPTION OF THE PRIOR ART

As is known to people of ordinary skill in the art, a semiconductor wafer having a plurality of devices such as IC's, LSI's or the like, which are formed in a matrix state on the front surface of a semiconductor substrate such as a silicon substrate and are composed of a laminate consisting of an insulating film and a functional film, is manufactured in the production process of a semiconductor device. In the semiconductor wafer formed as described above, the above devices are sectioned by dividing lines called "streets", and individual devices are manufactured by dividing the semiconductor wafer along the streets.

Dividing along the streets of the above semiconductor wafer is generally carried out by using a cutting machine called "dicer". This cutting machine has a chuck table for holding a semiconductor wafer as a workpiece, a cutting means for cutting the semiconductor wafer held on the chuck table, and a moving means for moving the chuck table and the cutting means relative to each other. The cutting means comprises a rotary spindle which is rotated at a high speed and a cutting blade mounted on the spindle. The cutting blade comprises a disk-like base and an annular cutting edge which is mounted on the side surface of the outer peripheral portion of the base and formed by fixing diamond abrasive grains having a diameter of about 3 μm to the base by electroforming.

To improve the throughput of a device such as IC, LSI or the like, a semiconductor wafer comprising devices which are composed of a laminate consisting of a low-dielectric insulating film (Low-k film) made of an inorganic material such as SiOF or BSG (SiOB) or an organic material such as a polyimide-based polymer or a parylene-based polymer and a functional film for forming circuits, on the front surface of a semiconductor substrate such as a silicon substrate has recently been implemented.

It is difficult to cut the above Low-k film and the wafer at the same time with the cutting blade because the Low-k film is made of a material different from that of the wafer. That is, as the Low-k film is extremely fragile like mica, when the above semiconductor wafer having the Low-k film is cut along the streets with the cutting blade, a problem arises in that the Low-k film peels off, and this peeling reaches the circuits and deals a fatal blow to the devices.

To solve the above problems, JP-A 2005-64231 discloses a wafer dividing method in which a semiconductor wafer is cut along streets by forming two grooves along the streets formed on the semiconductor wafer to divide the laminate, positioning the cutting blade between the outer sides of the two grooves, and moving the cutting blade and the semiconductor wafer relative to each other.

Although the laminate consisting of an insulating film and a functional film is molten and evaporated by applying a pulse laser beam along the streets to form grooves, the peeling of the laminate may occur on the outer sides of the grooves. It is considered that this phenomenon occurs due to the energy density of the pulse laser beam and the heat conduction speed to the semiconductor substrate.

SUMMARY OF THE INVENTION

It is an object of the present invention to provide a wafer laser processing method for forming grooves by applying a pulse laser beam along streets for sectioning a wafer having a plurality of devices which are composed of a laminate consisting of an insulating film and a functional film on the front surface of a semiconductor substrate made of silicon, which can suppress the peeling of the laminate to an extent that it does not affect the devices substantially even if it occurs on the outer sides of the grooves.

To attain the above object, according to the present invention, there is provided a wafer laser processing method for forming grooves along streets by applying a pulse laser beam along the streets for sectioning a plurality of devices of a wafer having the plurality of devices which are composed of a laminate consisting of an insulating film and a functional film, on the front surface of a substrate, wherein the pulse laser beam is set to have a repetition frequency of 150 kHz to 100 MHz and an energy per unit length of 5 to 25 J/m.

Since the repetition frequency of the pulse laser beam is set to 150 kHz to 100 MHz and the energy per unit length of the pulse laser beam is set to 5 to 25 J/m in the wafer laser processing method of the present invention, even when the peeling of the laminate occurs on the outer sides of the grooves, the size of the peeling is extremely small, and there is no substantial influence on the devices.

DETAILED DESCRIPTION OF THE PREFERRED EMBODIMENT

A preferred embodiment of the present invention will be described in more detail with reference to the accompanying drawings.

Figure 1:
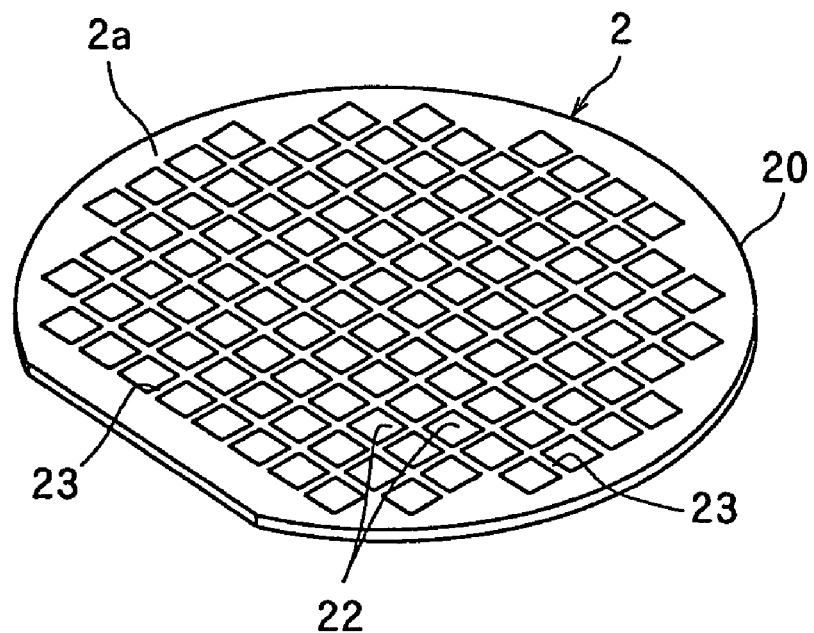
FIG. 1 is a perspective view of a semiconductor wafer to be divided by the wafer laser processing method of the present invention.
Figure 2:
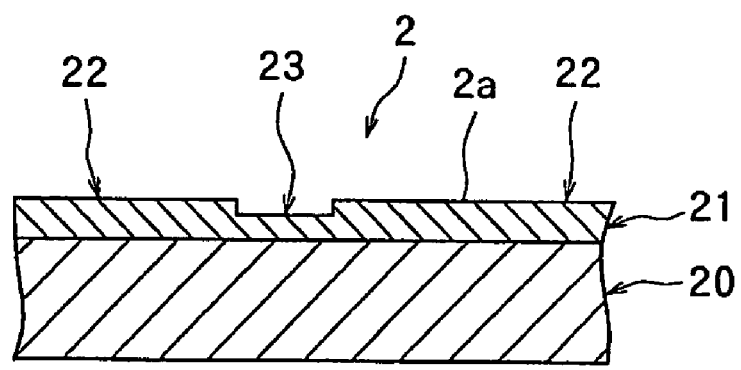
FIG. 2 is an enlarged sectional view of the semiconductor wafer shown in FIG. 1.

FIG. 1 is a perspective view of a semiconductor wafer as a workpiece to be processed by the wafer laser processing method of the present invention, and FIG. 2 is an enlarged sectional view of the principal portion of the semiconductor wafer shown in FIG. 1. In the semiconductor wafer 2 shown in FIG. 1 and FIG. 2, a plurality of devices 22 such as IC's or LSI's are formed in a matrix state on the front surface of a semiconductor substrate 20 such as a silicon substrate and composed of a laminate 21 consisting of an insulating film and a functional film for forming circuits. The devices 22 are sectioned by streets 23 formed in a lattice pattern. In the illustrated embodiment, the insulating film forming the laminate 21 is an $SiO_2$ film or a low-dielectric insulating film (Low-k film) made of an inorganic material such as SiOF or BSG (SiOB) or an organic material such as a polyimide-based or parylene-based polymer.

Figure 3:
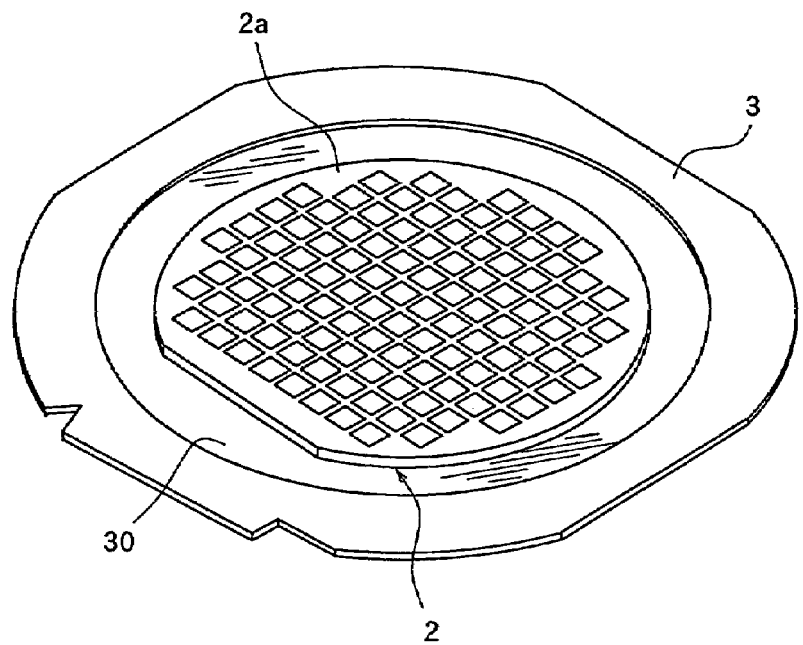
FIG. 3 is a perspective view showing a state where the semiconductor wafer shown in FIG. 1 is supported to an annular frame through a protective tape.

To divide the above-described semiconductor wafer 2 along the streets 23, the semiconductor wafer 2 is put on a protective tape 30 mounted on an annular frame 3 as shown in FIG. 3. At this point, the semiconductor wafer 2 is put on the protective tape 4 in such manner that the front surface 2a faces up.

Next comes a laser beam application step for removing the laminate 21 on the streets 23 by applying a laser beam along the streets 23 of the semiconductor wafer 2. This laser beam application step is carried out by using a laser beam processing machine 4 shown in FIGS. 4 and 5. The laser beam processing machine 4 shown in FIGS. 4 and 5 has a chuck table 41 for holding a workpiece and a laser beam application means 42 for applying a laser beam to the workpiece held on the chuck table 41. The chuck table 41 is designed to suction-hold the workpiece and to be moved in a processing-feed direction indicated by an arrow X and an indexing-feed direction indicated by an arrow Y by moving mechanisms (not shown) in FIG. 4.

Figure 5:
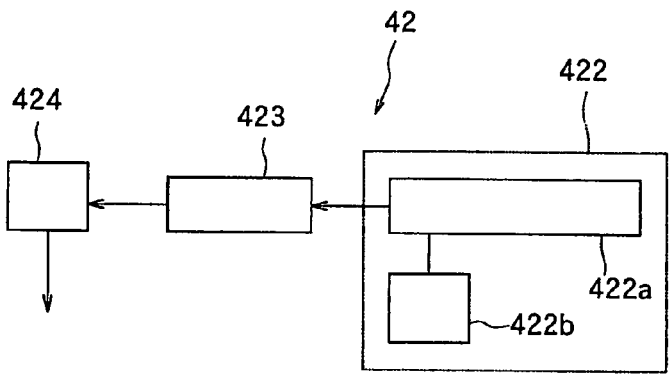
FIG. 5 is a schematic block diagram of a laser beam application means provided in the laser beam processing machine shown in FIG. 4.

The above laser beam application means 42 comprises a cylindrical casing 421 arranged substantially horizontally. In the casing 421, there are installed a pulse laser beam oscillation means 422 and an output adjustment means 423, as shown in FIG. 5. The pulse laser beam oscillation means 422 is constituted by a pulse laser beam oscillator 422a composed of a YAG laser oscillator or YVO4 laser oscillator and a repetition frequency setting means 422b connected to the pulse laser beam oscillator 422a. The repetition frequency setting means 422b employs a mode lock system and is designed to set the repetition frequency of a pulse laser beam oscillated from the pulse laser beam oscillation means 422 to 150 kHz to 100 MHz in the illustrated embodiment. The above output adjustment means 423 adjusts the output of a pulse laser beam oscillated from the pulse laser beam oscillation means 422 to a desired value. The pulse laser beam oscillation means 422 and the output adjustment means 423 are controlled by a control means that is not shown. A condenser 424 constituted by a combination of condensing lenses (not shown) which may be known per se, is mounted onto the end of the above casing 421. This condenser 424 focuses a pulse laser beam oscillated from the above pulse laser beam oscillation means 422 to a predetermined focal spot diameter and applies it to the workpiece held on the above chuck table 41.

Figure 4:
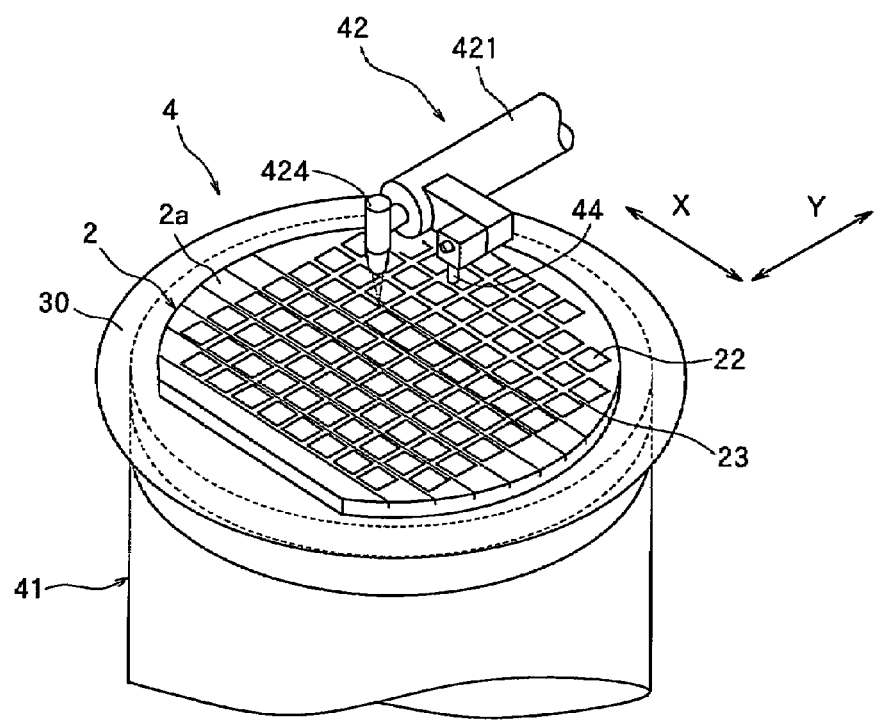
FIG. 4 is a perspective view of the principal portion of a laser beam processing machine for carrying out the wafer laser processing method of the present invention.

The illustrated laser beam processing machine 4 comprises an image pick-up means 44 mounted on the end portion of the casing 421 constituting the above laser beam application means 42 as shown in FIG. 4. This image pick-up means 44 picks up an image of the workpiece held on the chuck table 41. The image pick-up means 44 is constituted by an optical system and an image pick-up device (CCD), etc. and supplies an image signal to the control means that is not shown.

A description is subsequently given of the laser beam application step which is carried out by using the above laser beam processing machine 4 with reference to FIG. 4, FIGS. 6(a) and 6(b) and FIG. 7.

In this laser beam application step, the semiconductor wafer 2 is first placed on the chuck table 41 of the laser beam processing machine 4 shown in FIG. 4 and suction-held on the chuck table 41. At this point, the semiconductor wafer 2 is held in such a manner that the front surface 2a faces up. Although the annular frame 3 on which the protective tape 30 is mounted is not shown in FIG. 4, it is held by a suitable frame holding means provided on the chuck table 41.

The chuck table 41 suction-holding the semiconductor wafer 2 as described above is moved to a position right below the image pick-up means 44 by a processing-feed means that is not shown. After the chuck table 41 is positioned right below the image pick-up means 44, alignment work for detecting the area to be processed of the semiconductor wafer 2 is carried out by the image pick-up means 44 and the control means that is not shown. That is, the image pick-up means 44 and the control means (not shown) carry out image processing such as pattern matching, etc. to align a street 23 formed in a predetermined direction of the semiconductor wafer 2 with the condenser 424 of the laser beam application means 42 for applying a laser beam along the street 23, thereby performing the alignment of a laser beam application position. The alignment of the laser beam application position is also carried out on streets 23 formed on the semiconductor wafer 2 in a direction perpendicular to the above predetermined direction.

Figure 6:
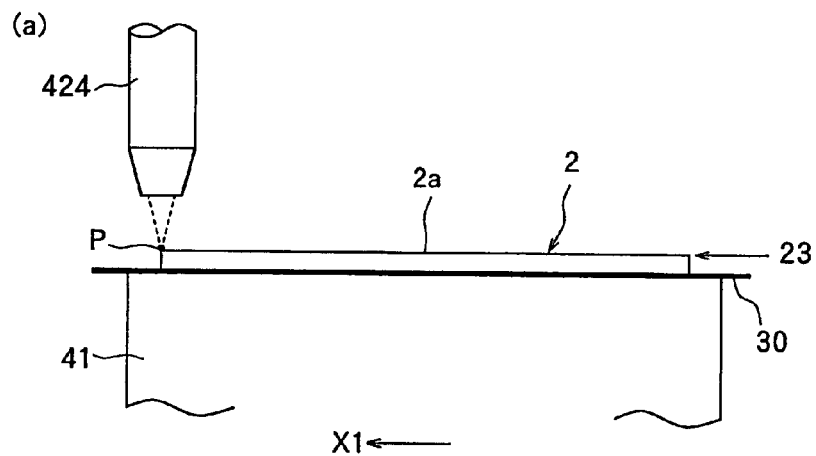
FIGS. 6(a) and 6(b) are explanatory diagrams showing a laser beam application step in the wafer laser processing method of the present invention.
Figure 6:
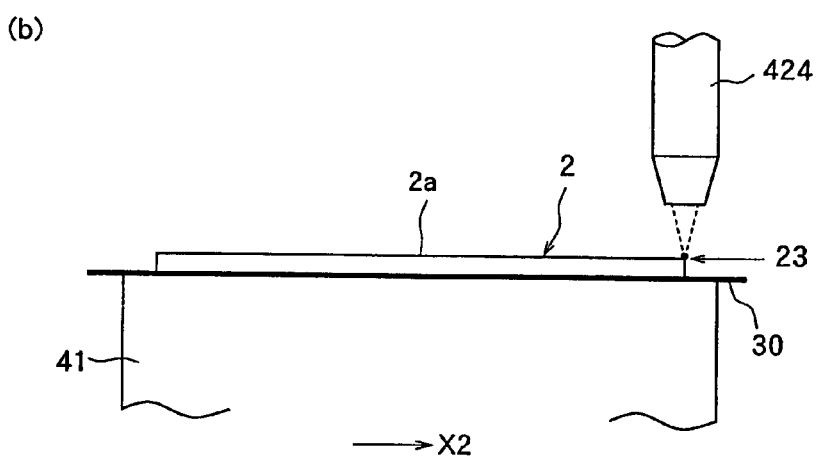

After the alignment of the laser beam application position is carried out by detecting the street 23 formed on the semiconductor wafer 2 held on the chuck table 41 as described above, the chuck table 41 is moved to a laser beam application area where the condenser 424 of the laser beam application means 42 for applying a laser beam is located so as to position the predetermined street 23 right below the condenser 424 as shown in FIGS. 6(a) and 6(b). At this point, as shown in FIG. 6(a), the semiconductor wafer 2 is positioned such that one end (left end in FIG. 6(a)) of the street 23 is located right below the condenser 424. The chuck table 41 is then moved in the direction indicated by the arrow X1 in FIG. 6(a) at a predetermined processing-feed rate while a pulse laser beam having absorptivity for the laminate 21 is irradiated from the condenser 424 of the laser beam application means 42. When the other end (right end in FIG. 6(b)) of the street 23 reaches a position right below the condenser 424 as shown in FIG. 6(b), the application of the pulse laser beam is suspended and the movement of the chuck table 41 is stopped. In this laser beam application step, the focal point P of the pulse laser beam is set to a position near the front surface of the street 23.

Thereafter, the chuck table 41 is moved about 30 to 40 μm in a direction (indexing-feed direction) perpendicular to the sheet. The chuck table 41, that is, the semiconductor wafer 2 is then moved in the direction indicated by the arrow X2 in FIG. 6(b) at a predetermined processing-feed rate while a pulse laser beam is applied from the condenser 424 of the laser beam application means 42. When the position shown in FIG. 6(a) is reached, the application of the pulse laser beam is suspended and the movement of the chuck table 41, that is, the semiconductor wafer 2 is stopped.

Figure 7:
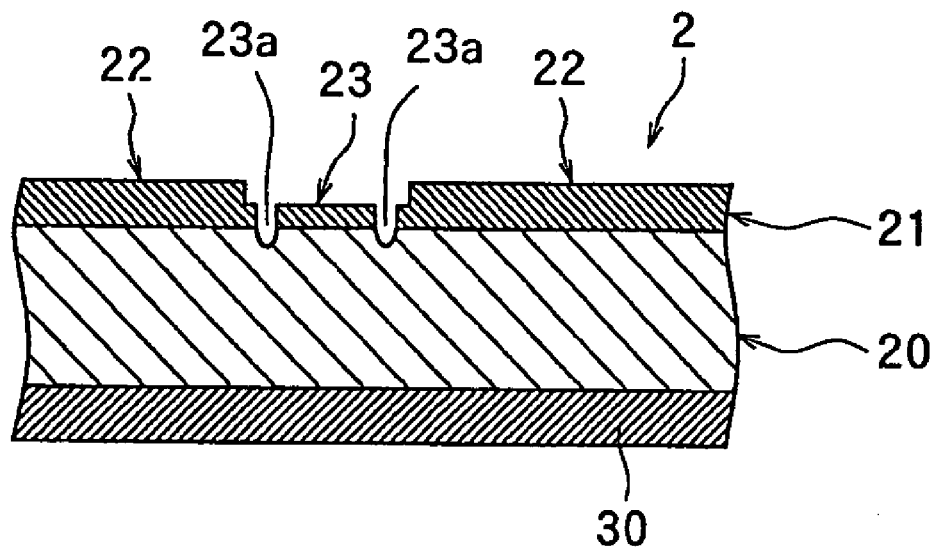
FIG. 7 is an enlarged sectional view of the principal portion of the semiconductor wafer having grooves which are formed along the streets of the semiconductor wafer by the laser beam application step shown in FIGS. 6(a) and 6(b)
Figure 8:
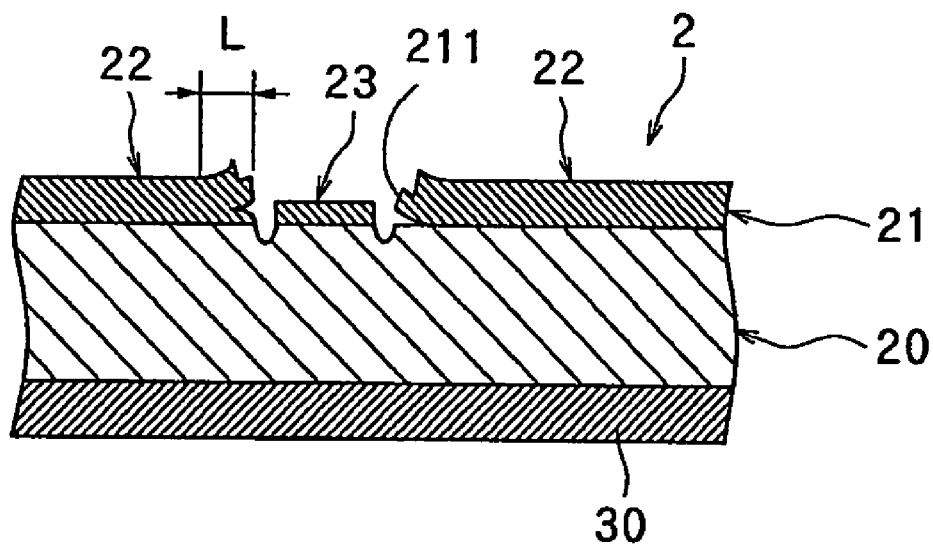
FIG. 8 is an explanatory diagram showing a state where peeling has occurred on the outer sides of the grooves formed in the semiconductor wafer.

By carrying out the above laser beam application step, two grooves 23a and 23a deeper than the thickness of the laminate 21 are formed in the street 23 of the semiconductor wafer 2 as shown in FIG. 7. As a result, the laminate 21 is separated by the two grooves 23a and 23a. The interval between the outer sides of the two grooves 23a and 23a formed in the street 23 is set larger than the thickness of the cutting blade which will be described later. The above laser beam application step is carried out on all the streets 23 formed on the semiconductor wafer 2. The processing quality of the grooves 23a formed by this laser beam application step is influenced by processing conditions, especially the repetition frequency and energy per unit length of the applied pulse laser beam. That is, it has been found that when the repetition frequency and energy per unit length of the pulse laser beam were not set to predetermined ranges, the laminate 21 peeled off on the outer sides of the grooves 23a and 23a and the size L of an exfoliated portion 211 was large as shown in FIG. 8.

According to experiments conducted by the inventors of the present invention, it has been found that when a pulse laser beam of a wavelength having absorptivity for the laminate 21 (for example, 200 to 800 nm) was used, the repetition frequency of the pulse laser beam was set to 150 kHz to 100 MHz, and the energy per unit length of the pulse laser beam was set to 5 to 25 J/m, even if the processing-feed rate exceeded 100 mm/sec which is a practical speed, the size L of the exfoliated portion 211 became 10 µm or less, which means that there is no substantial influence on the devices. Particularly when the repetition frequency of the pulse laser beam was set to 80 MHz and the energy per unit length of the pulse laser beam was set to 12.5 J/m, even if the processing-feed rate was 200 mm/sec, the size L of the exfoliated portion 211 became 1 µm or less. At this point, the wavelength of the pulse laser beam was 355 nm and the focal spot diameter of the pulse laser beam was 10 µm. Thus, it is presumed that when the repetition frequency of the pulse laser beam is increased, the next pulse is applied before the processed portion having temperature raised by the former pulse is cooled and hence, the temperature of the processed portion does not fall below the softening temperature of the laminate 21, whereby the peeling of the laminate is suppressed.

Figure 9:
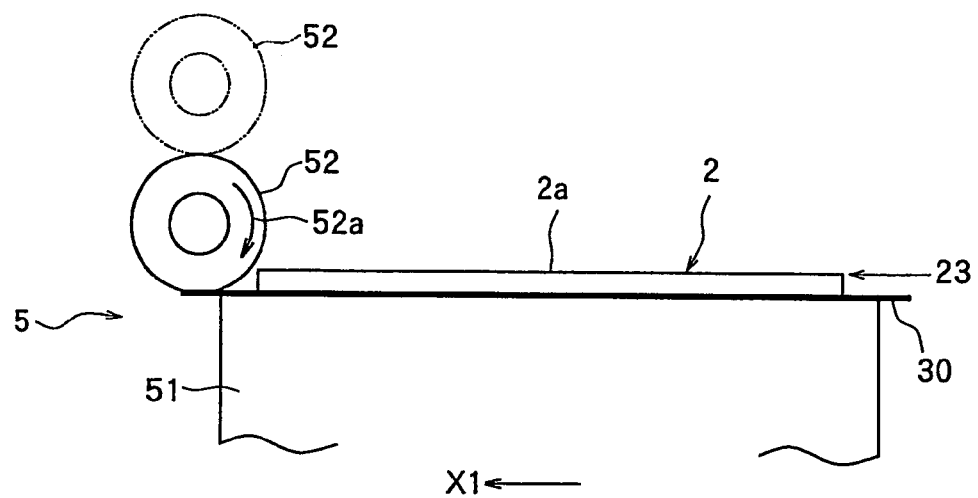
FIG. 9 is an explanatory diagram showing a cutting step for cutting the semiconductor wafer along the streets after the grooves are formed by the wafer laser processing method of the present invention.

After the above laser beam application step is carried out on all the streets 23 formed on the semiconductor wafer 2, next comes the step of cutting the semiconductor wafer 2 along the streets 23. That is, the semiconductor wafer 2 which has been subjected to the laser beam application step is placed on the chuck table 51 of a cutting machine 5 in such a manner that the front surface 2a faces up as shown in FIG. 9 and held on the chuck table 51 by a suction means that is not shown. The chuck table 51 holding the semiconductor wafer 2 is then moved to the cutting start position of the area to be cut. At this point, the semiconductor wafer 2 is positioned such that one end (left end in FIG. 9) of the street 23 to be cut is situated on the right side a predetermined distance from right below the cutting blade 52, as shown in FIG. 9.

Figure 10:
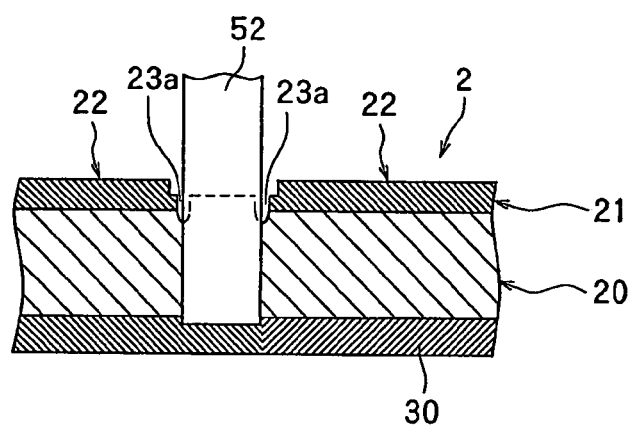
FIG. 10 is an explanatory diagram showing the cutting-in feed position of a cutting blade in the cutting step shown in FIG. 9.

After the chuck table 51 holding the semiconductor wafer 2 is moved to the cutting start position of the area to be cut, the cutting blade 52 is moved (cutting-in fed) down from its standby position shown by a two-dotted chain line in FIG. 9 to a predetermined cutting-in feed position shown by a solid line in FIG. 9. This cutting-in feed position is set to a position where the lower end of the cutting blade 52 reaches the protective tape 30 affixed to the rear surface of the semiconductor wafer 2 as shown in FIG. 10.

Meanwhile, the cutting blade 52 is rotated in the direction indicated by an arrow 52a at a predetermined revolution speed, and the chuck table 51 is moved in the direction indicated by the arrow X1 in FIG. 9 at a predetermined cutting-feed rate. When the other end (right end in FIG. 9) of the street 23 of the semiconductor wafer 2 held on the chuck table 51 reaches a position on the left side a predetermined distance from right below the cutting blade 52, the movement of the chuck table 51 is stopped. By moving the chuck table 51 in the cutting-feed direction, the semiconductor wafer 23 is divided along the street 23. When the two grooves 23a and 23a are cut with the cutting blade 52 as described above, the laminate 21 remaining between the two grooves 23a and 23a is cut with the cutting blade 52 but does not affect the chips 22 even if the laminate 21 peels off, as it has been divided by the two grooves 23a and 23a.

The chuck table 51, that is, the semiconductor wafer 2 is moved (indexing-fed) a distance corresponding to the interval between streets 23 in the direction (indexing-feed direction) perpendicular to the sheet to bring the street 23 to be cut next to a position corresponding to the cutting blade 52, thereby returning to the state shown in FIG. 9. Then, the above cutting step is carried out.

The above cutting step is carried out under the following processing conditions, for example.

Cutting blade: outer diameter of 52 mm, thickness of 30 µm
    Revolution of cutting blade: 40,000 rpm
    Cutting-feed rate: 50 mm/sec The above cutting step is carried out on all the streets 23 formed on the semiconductor wafer 2. As a result, the semiconductor wafer 2 is cut along the streets 23 to be divided into individual devices.

What is claimed is:

1. A wafer laser processing method for forming grooves along streets of a wafer for sectioning a plurality of devices of the wafer, the plurality of devices being composed of a laminate consisting of an insulating film and a functional film on a front surface of the wafer, said method comprising
setting a pulse laser beam to have a repetition frequency of 150 kHz to 100 MHz and an energy per unit length of 5 to 25 J/m, and
applying the pulse laser beam to the wafer to obtain a processed portion of the wafer with a temperature that does not fall below a softening temperature of the laminate.

2. The wafer laser processing method according to claim 1, comprising
setting the pulse laser beam to have a wavelength of 355 nm, a focal spot diameter of 10 µm, a repetition frequency of 80 MHz, and an energy per unit length of 12.5 J/m.

\* \* \* \* \*